(12) United States Patent
Khrushchev

(10) Patent No.: US 9,383,070 B2
(45) Date of Patent: Jul. 5, 2016

(54) LIGHTING DEVICE

(71) Applicant: OSRAM GmbH, Munich (DE)

(72) Inventor: Sergey Khrushchev, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/403,586

(22) PCT Filed: May 27, 2013

(86) PCT No.: PCT/EP2013/060897
§ 371 (c)(1),
(2) Date: Nov. 25, 2014

(87) PCT Pub. No.: WO2013/182450
PCT Pub. Date: Dec. 12, 2013

(65) Prior Publication Data
US 2015/0167905 A1    Jun. 18, 2015

(30) Foreign Application Priority Data

Jun. 6, 2012   (DE) .......................... 10 2012 209 593

(51) Int. Cl.
*F21V 9/16*      (2006.01)
*F21V 7/04*      (2006.01)
*F21K 99/00*     (2016.01)
(Continued)

(52) U.S. Cl.
CPC ................. *F21K 9/56* (2013.01); *F21V 7/0066* (2013.01); *F21V 7/06* (2013.01); *F21V 9/16* (2013.01); *F21V 13/08* (2013.01); *F21V 13/14* (2013.01); *F21V 14/00* (2013.01); *G02B 27/0905* (2013.01); *G02B 27/0938* (2013.01); *F21V 7/0033* (2013.01); *F21V 7/22* (2013.01);
(Continued)

(58) Field of Classification Search
CPC ......... F21K 9/56; F21V 7/0066; F21V 13/14; F21V 14/00; F21V 13/08; F21V 7/06; F21V 9/16; F21V 13/04; F21V 7/0033; F21V 7/22; G02B 27/0938; G02B 27/0905; H01S 5/005; H01S 5/4012; F21Y 2101/025
See application file for complete search history.

(56) References Cited

U.S. PATENT DOCUMENTS 7,421,165 B2    9/2008   Wanninger
2007/0153368 A1   7/2007   Vucinic et al.
(Continued)

FOREIGN PATENT DOCUMENTS

DE         10250912 A1    5/2004
DE    102010001945 A1    8/2011
(Continued)

OTHER PUBLICATIONS

International Search Report issued for PCT/EP2013/060897 on Nov. 4, 2013.
(Continued)

*Primary Examiner* — Donald Raleigh
(74) *Attorney, Agent, or Firm* — Viering, Jentschura & Partner mbB

(57) ABSTRACT

A lighting device may include a plurality of laser light sources, and an optical apparatus for concentrating the light emitted by the laser light sources. The optical apparatus has at least one ring-shaped reflector having a parabolic light reflection surface and at least one light conversion element for light wavelength conversion, which is arranged at the focus of the at least one ring-shaped reflector.

11 Claims, 2 Drawing Sheets

(51) Int. Cl.
*F21V 7/06* (2006.01)
*F21V 13/08* (2006.01)
*G02B 27/09* (2006.01)
*F21V 13/14* (2006.01)
*F21V 14/00* (2006.01)
*F21V 7/00* (2006.01)
*F21V 7/22* (2006.01)
*F21V 13/04* (2006.01)
*H01S 5/40* (2006.01)
*F21Y 101/02* (2006.01)
*H01S 5/00* (2006.01)

(52) U.S. Cl.
CPC ............ *F21V13/04* (2013.01); *F21Y 2101/025* (2013.01); *H01S 5/005* (2013.01); *H01S 5/4012* (2013.01)

(56) References Cited

U.S. PATENT DOCUMENTS

| | | |
|---|---|---|
| 2008/0304268 A1 | 12/2008 | To |
| 2009/0302739 A1 | 12/2009 | Levon |
| 2010/0002735 A1* | 1/2010 | Egawa ............... G02F 1/37 372/22 |
| 2010/0327745 A1 | 12/2010 | Dassanayake et al. |
| 2011/0199580 A1 | 8/2011 | Hirata et al. |
| 2011/0249436 A1* | 10/2011 | Li ............... F21V 9/16 362/235 |
| 2011/0299267 A1 | 12/2011 | Levon |
| 2012/0051074 A1* | 3/2012 | Takahashi ........... F21S 48/1145 362/509 |
| 2012/0057364 A1* | 3/2012 | Kishimoto ............ F21S 48/115 362/538 |
| 2013/0208478 A1* | 8/2013 | Bowden .................... F21V 7/06 362/260 |

FOREIGN PATENT DOCUMENTS

| | | |
|---|---|---|
| EP | 2360523 A1 | 8/2011 |
| GB | 2459003 A | 10/2009 |
| WO | 03001200 A2 | 1/2003 |

OTHER PUBLICATIONS

Search Report issued for parallel German patent application No. 102012209593.4 on Jul. 27, 2012.

\* cited by examiner

LIGHTING DEVICE

RELATED APPLICATIONS

The present application is a national stage entry according to 35 U.S.C. §371 of PCT application No.: PCT/EP2013/060897 filed on May 27, 2013, which claims priority from German application No.: 10 2012 209 593.4 filed on Jun. 6, 2012, and is incorporated herein by reference in its entirety.

TECHNICAL FIELD

Various embodiments relate to a lighting device.

BACKGROUND

A lighting device of this type is disclosed in DE 102 50 912 A1, for example. Said document describes a lighting device including an apparatus for coupling light from a plurality of light sources into an optical waveguide. The coupling-in apparatus has a plurality of focusing optical units for focusing the light emitted by the light sources. The light sources and focusing optical units are arranged along a spherical surface, such that the light which is emitted by the light sources and concentrated by the focusing optical units impinges on the optical waveguide at very different angles of incidence. The arrangement of the light sources and of the focusing optical units has to be coordinated with the numerical aperture or the acceptance angle of the optical waveguide. Therefore, with the coupling-in apparatus described above, light from only a small number of light sources can be coupled into the optical waveguide.

SUMMARY

Various embodiments provide a lighting device of the generic type which enables an improved coupling-in of light or concentration of light from a plurality of light sources into an optical waveguide, a fiber-optic unit or a light conversion element.

The lighting device according to various embodiments has a plurality of laser light sources and an optical apparatus for concentrating the light emitted by the laser light sources. According to various embodiments, the optical apparatus has at least one ring-shaped reflector having a parabolic light reflection surface and at least one light conversion element for light wavelength conversion which is arranged at the focus or in the vicinity of the focus of the at least one ring-shaped reflector.

The abovementioned features of the optical apparatus of the lighting device according to various embodiments make it possible to concentrate light from many laser light sources in an almost punctiform region and for example to couple it into a fiber-optic unit or an optical waveguide or to concentrate it onto a light conversion element or to use the lighting device according to various embodiments as virtually a point light source having high luminance for projection applications or in spotlights/headlights, in particular in vehicle headlights. By virtue of the fact that the optical apparatus has at least one ring-shaped reflector having a parabolic light reflection surface, the light from virtually as many laser light sources as desired can be concentrated at the focus of the at least one reflector mentioned above by means of the laser light sources being arranged and aligned along one or a plurality of fictitious circle lines in such a way that they emit light in directions parallel to the ring axis of the at least one reflector and thus also parallel to the axis of rotational symmetry of the parabolic light reflection surface.

In this context, light means electromagnetic radiation which encompasses—not exclusively—the ultraviolet, visible and infrared wavelength range.

The at least one light conversion element advantageously has a carrier provided with phosphor. By means of phosphor, a wavelength conversion of the light emitted by the laser light sources can be realized in a simple manner. The carrier can serve for positioning the phosphor at the focus or in the vicinity of the focus of the at least one reflector and as a heat sink for the phosphor.

In various embodiments, the phosphor is arranged as a coating on a surface of the carrier. As a result, it is possible to control the relative proportion of converted light and non-converted light by means of the layer thickness of the phosphor coating and the phosphor concentration in the phosphor coating, for example in the case of a conversion of blue excitation light into yellow conversion light, which together with a non-converted proportion of the excitation light produces white mixed light. The phosphor can be an individual phosphor or a mixture of a plurality of phosphors. The phosphor coating on the surface of the carrier may include one or a plurality of phosphor layers.

The carrier for the phosphor may be embodied as transparent in order to keep light losses low. In addition, the carrier can be provided with an antireflection coating in order to reduce the light losses further.

In various embodiments, the carrier for the phosphor has at least one light-reflecting surface. As a result of reflection at the light-reflecting surface, the path of the light in the light conversion element is lengthened and the relative proportion of the converted light is thus increased.

The carrier for the phosphor and the at least one ring-shaped reflector having a parabolic reflection surface may be arranged in such a way that the light reflected by the at least one ring-shaped reflector impinges on a surface of the carrier at an angle of incidence that corresponds at least to the Brewster angle of the carrier material. The light losses caused by reflection at the carrier can be greatly reduced as a result. If the light impinges on the carrier surface at the Brewster angle or at an angle that is greater than the Brewster angle, only the light portions that are polarized perpendicularly to the surface of the carrier are reflected. Since laser light is polarized, what can therefore be achieved by suitable arrangement of ring-shaped reflector and carrier is that the laser light impinges on the carrier at an angle that is not less than the Brewster angle of the carrier material, and, consequently, no laser light is reflected at the carrier surface.

In various embodiments, the laser light sources are each provided with a collimator in order that the light emitted slightly divergently by the laser light sources is largely parallelized, such that it is emitted as parallel as possible to the ring axis of the at least one ring-shaped reflector.

In various embodiments, the lighting device is equipped with laser light sources, in particular laser diodes, which emit blue light from the wavelength range of 380 nm to 490 nm, and the at least one light conversion element of the lighting device according to the various embodiments includes phosphor which converts the blue light emitted by the laser light sources proportionally into light from the spectral range of yellow light with a dominant wavelength from the wavelength range of 560 nm to 590 nm. White light that is a mixture of converted yellow light and non-converted blue light is thereby generated in a simple manner.

The lighting device according to various embodiments may serve as virtually a point light source for one or a plurality of motor vehicle headlights or for applications in video projection, in effect spotlights, in industrial image processing or in medical illumination and diagnosis.

DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
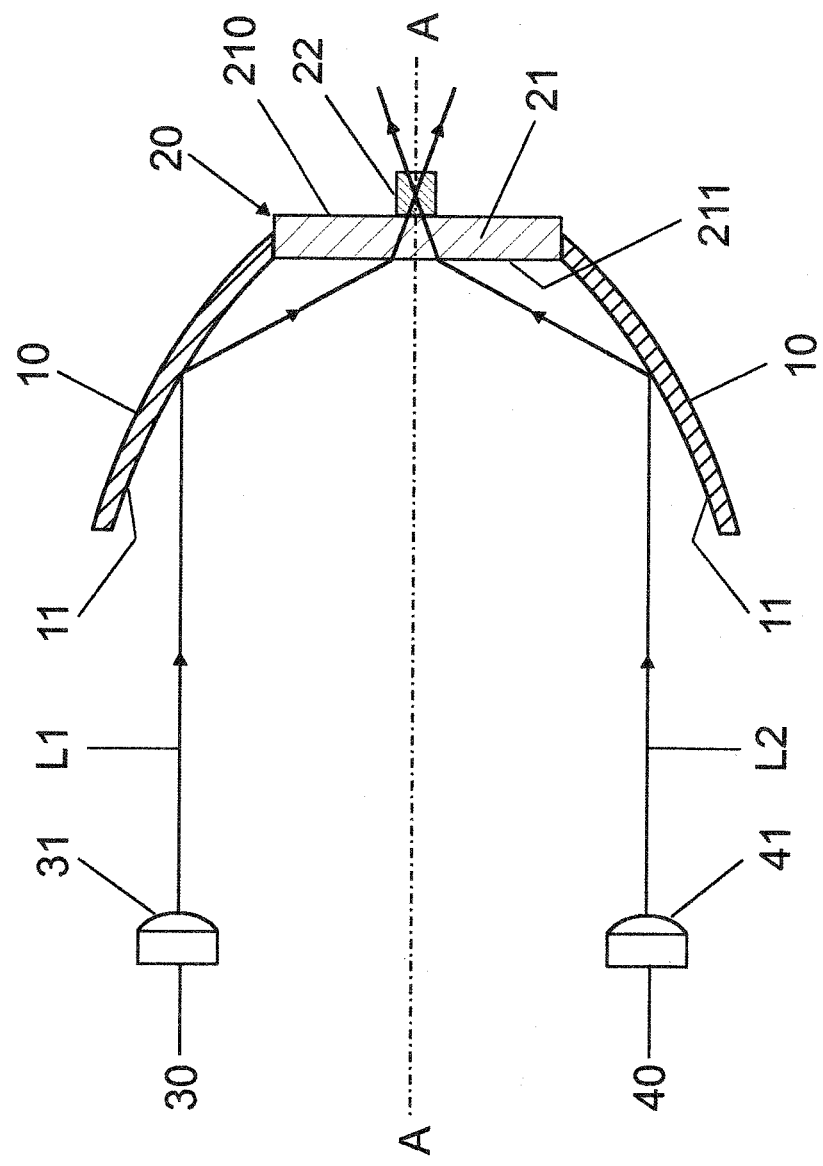
FIG. 1 shows a schematic sectional illustration of a lighting device in accordance with the first embodiment of the present disclosure.

The lighting device in accordance with the first embodiment of the present disclosure as illustrated schematically in FIG. 1 has a ring-shaped reflector 10 having a parabolic reflection surface 11, a light conversion element 20 and four laser diodes 30, 40 each equipped with a collimator lens 31, 41. Only two of the four laser diodes 30, 40 are depicted in FIG. 1. The light conversion element 20 consists of a transparent sapphire lamina 21 coated with phosphor 22 on one surface 210. The surface 210 coated with phosphor 22 is oriented perpendicularly to the ring axis A-A of the ring-shaped reflector 20. The parabolic reflection surface 11 of the reflector 10 is embodied as rotationally symmetrical relative to the ring axis A-A of the reflector. The reflector 10 and the light conversion element 20 are oriented and positioned in such a way that that section of the surface 210 of the sapphire lamina 21 which is coated with phosphor 22 is arranged at the focus or very near the focus of the reflector 10. During operation, the four laser diodes 30, 40 each emit blue light having a wavelength from the wavelength range of 380 nm to 490 nm, which is parallelized by means of the corresponding collimator lens 31 and 41, such that the light emitted by the four laser diodes 30, 40, after leaving the collimator lenses 31, 41, runs parallel to the ring axis A-A of the ring-shaped reflector 10. The light running parallel to the ring axis A-A impinges on the parabolic reflection surface 11 of the reflector 10 and is reflected to the focus of the reflector 10, at which the light conversion element 20 is positioned. Upon impinging on the light coupling-in surface 211 of the sapphire lamina 21 of the light conversion element 20, the light is refracted and directed to that section of the surface 210 of the sapphire lamina 21 which is coated with phosphor 22. At that section of the surface 210 which is coated with phosphor 22, said surface also being designated as the light coupling-out surface, the light leaves the sapphire lamina 21 and penetrates into the phosphor 22. FIG. 1 illustrates the beam path of the light by way of example on the basis of two light beams L1, L2. Cerium (Ce) doped yttrium aluminum garnet (YAG:Ce) serves as the phosphor 22. With the aid of the abovementioned phosphor 22, part of the blue light, upon passing through the phosphor 22, is converted into light from the yellow spectral range with a dominant wavelength from the wavelength range of 560 nm to 590 nm, such that the lighting device generates white light that is a mixture of yellow light converted by means of the phosphor 22 of the light conversion element 20 and non-converted blue light. The relative proportion of converted yellow light and non-converted blue light is determined by the thickness of the phosphor layer 22 on the light coupling-out surface 210 of the sapphire lamina 21 and by the concentration of the phosphor 22 in the coating. That section of the surface 210 of the sapphire lamina 21 which is coated with phosphor 22 has an area in the range of 1 $mm^2$ to 5 $mm^2$. The lighting device can therefore be regarded virtually as a point light source that emits white light.

Figure 2:
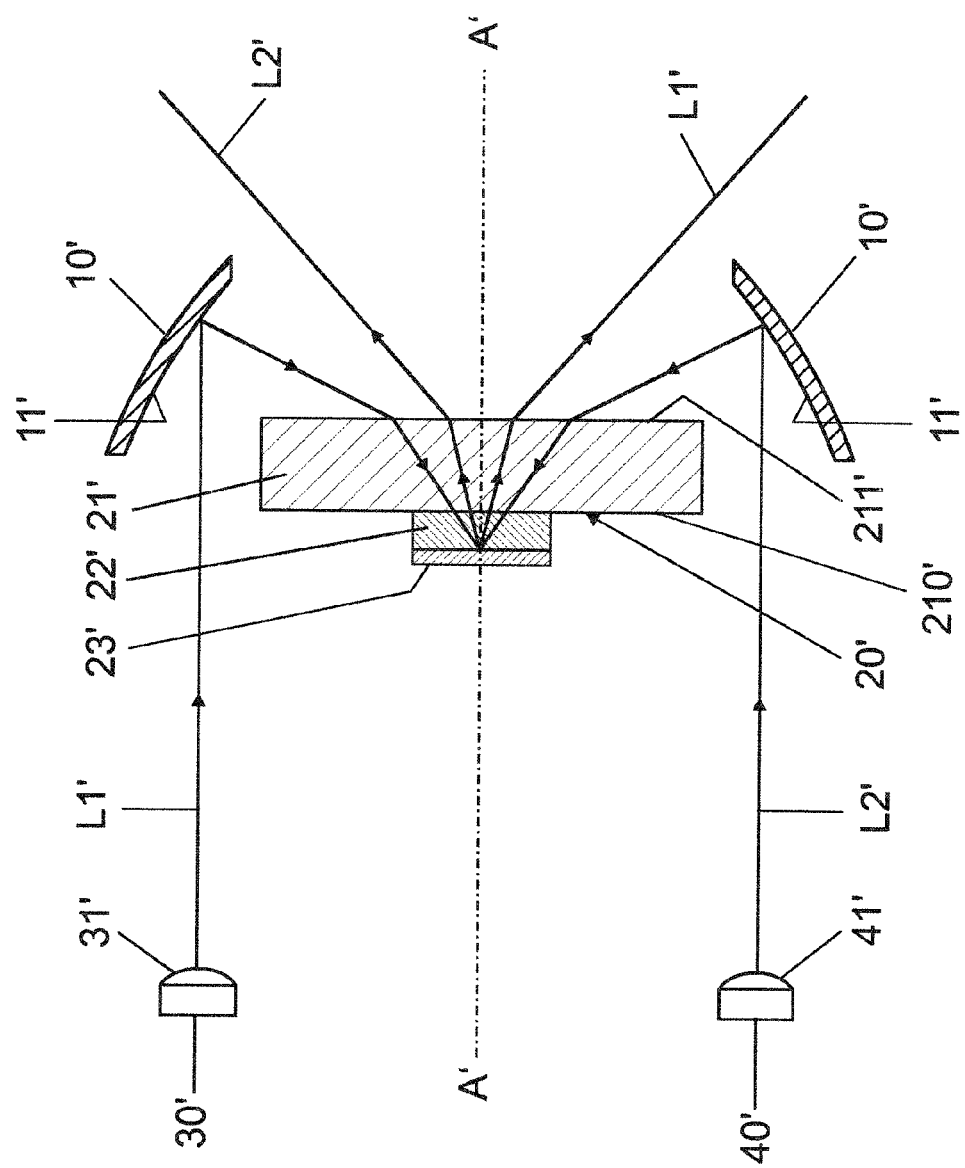
FIG. 2 shows a schematic sectional illustration of a lighting device in accordance with the second embodiment of the present disclosure.

The lighting device in accordance with the second embodiment of the present disclosure as illustrated schematically in FIG. 2 has a ring-shaped reflector 10' having a parabolic reflection surface 11', a light conversion element 20' and four laser diodes 30', 40' each equipped with a collimator lens 31', 41'. Only two of the four laser diodes 30', 40' are depicted in FIG. 2. The light conversion element 20' consists of a transparent sapphire lamina 21' coated with phosphor 22' on one surface 210' and a light-reflecting, metallic cover 23' for the phosphor 22'. The phosphor 22' is embodied as cerium (Ce) doped yttrium aluminum garnet (YAG:Ce) which converts blue light into yellow light having a dominant wavelength from the wavelength range of 560 nm to 590 nm. The surface 210' coated with phosphor 22' and with the light-reflecting cover 23' for the phosphor 22' is oriented perpendicularly to the ring axis A'-A' of the ring-shaped reflector 20'. The parabolic reflection surface 11' of the reflector 10' is embodied as rotationally symmetrical relative to the ring axis A'-A' of the reflector 10'. The reflector 10' and the light conversion element 20' are oriented and positioned in such a way that that section of the surface 210' of the sapphire lamina 21' which is coated with phosphor 22' is arranged at the focus or very near the focus of the reflector 10'. During operation, the four laser diodes 30', 40' each emit blue light having a wavelength from the wavelength range of 380 nm to 490 nm, which is parallelized by means of the corresponding collimator lens 31' and 41', such that the light emitted by the four laser diodes 30', 40', after leaving the collimator lenses 31', 41', runs parallel to the ring axis A'-A' of the ring-shaped reflector 10'. The light running parallel to the ring axis A'-A' impinges on the parabolic reflection surface 11' of the reflector 10' and is reflected to the focus of the reflector 10', at which the light conversion element 20' is positioned. Upon impinging on the light coupling-in surface 211' of the sapphire lamina 21' of the light conversion element 20', the light is refracted and directed to that section of the surface 210' of the sapphire lamina 21' which is coated with phosphor 22'. After passing through the phosphor 22', the light is reflected back into the phosphor 22' at the light-reflecting, metallic cover 23' and is once again coupled into the sapphire lamina 21'. Upon passing through the phosphor 22', part of the blue light is converted into yellow light, such that white light that is a mixture of converted yellow light and non-converted blue light emerges at the surface 211' of the sapphire lamina 21'. The white light that emerges again from the sapphire lamina 21' leaves the sapphire lamina 21' or the light conversion element 20' at the surface 211' at such emergence angles which prevent renewed reflection at the reflector 10'. FIG. 2 illustrates the beam path of the light by way of example on the basis of two light beams L1', L2'. The relative proportion of converted yellow light and non-converted blue light is determined by the thickness of the phosphor layer 22' on the surface 210' of the sapphire lamina 21' and by the concentration of the phosphor 22' in the coating. That section of the surface 210' of the sapphire lamina 21' which is coated with phosphor 22' has an area in the range of 1 mm² to 5 mm². The lighting device can therefore be regarded virtually as a point light source that emits white light.

One advantage of the arrangement depicted in FIG. 2 is that the metallic cover 23' can be used for cooling the phosphor. For this purpose, the cover 23' is embodied with an appropriate size and solid formation or includes a cooling rib structure or is equipped with further heat-dissipating apparatuses, such as a heat pump, for example.

In addition, the phosphor can be fixedly connected to the metallic cover 23' for the purpose of better thermal coupling, for example can be encapsulated with the metal body or incorporated into a cutout in the metal body.

A further advantage of the arrangement shown in FIG. 2 is that the phosphor is enclosed between cover 23' and sapphire lamina 21' and thus does not constitute a hazard for the environment in the event of embrittlement.

A further advantage of the arrangement shown in FIG. 2 is that, by means of the degree of polarization of the laser light sources, the proportion of the laser light which is reflected directly at the light coupling-in surface 211' of the sapphire lamina 21', that is to say which does not contribute to the conversion in the phosphor, can be varied for instance in the range of 0 to 6%. It is thus possible to vary the proportion of the unconverted light with respect to the converted light and, consequently, to bring about a targeted change in the color temperature of the mixed light.

In both the embodiments, the four laser diodes 30, 40 and 30', 40' are arranged at the corners of a fictitious square and positioned relative to the ring-shaped reflector 10 and 10' and the light conversion element 20 and 20' in such a way that the light impinges on the surface 210 and 210' of the sapphire lamina 21 and 21' at least at the Brewster angle. As a result, no reflection occurs at the surface 210 and 210' when the light is coupled into the sapphire lamina 21 and 21'.

The disclosure is not restricted to the embodiments of the disclosure explained in greater detail above. By way of example, the laser light sources can emit identical or different monochromatic light. They can be operated in continuous wave or clocked operation. The laser light sources, the parabolic reflector and the light conversion element can each per se be mounted rotatably about the optical axis or the ring axis of the parabolic reflector (A-A or A'-A'). In this regard, by way of example, two sets each of four laser diodes offset relative to one another in the clockwise direction can be provided, which can have different properties, such as their emission radiation, for example. In this regard, different sets of in each case four laser light sources, for example, can therefore be used virtually according to the turret principle. In particular, in this way it is possible to combine different sets of laser light sources which emit light of different colors or polarizations, for example. The laser light sources belonging to different sets of laser light sources can be arranged for example at different distances from the ring axis, in order for example to be able to vary the degree of polarization or the color of the light.

Moreover, a plurality of ring-shaped parabolic reflectors can be embodied coaxially in a plurality of sets which can be rotated according to the turret principle. In particular, these reflectors can have a common focus. Different reflection properties, for example reflection angles or degrees of polarization, can thus be set.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device comprising:
   a plurality of laser light sources, and
   an optical apparatus for concentrating the light emitted by the laser light sources,
   wherein the optical apparatus has at least one ring-shaped reflector having a parabolic light reflection surface and at least one light conversion element for light wavelength conversion, which is arranged at the focus of the at least one ring-shaped reflector, and
   wherein the laser light sources of said plurality of laser light sources are arranged around the ring axis of said at least one ring-shaped reflector so that light emitted by the laser light sources is emitted in directions parallel to the ring axis of the at least one ring-shaped reflector and impinges on a parabolic light reflection surface of said at least one ring-shaped reflector and is reflected towards the focus of the at least one ring-shaped reflector, at which said at least one light conversion element for light wavelength conversion is positioned.

2. The lighting device as claimed in claim 1, wherein the at least one light conversion element has a carrier provided with phosphor.

3. The lighting device as claimed in claim 2, wherein the phosphor is arranged as a coating on a surface of the carrier.

4. The lighting device as claimed in claim 3, wherein the carrier is transparent.

5. The lighting device as claimed in claim 3, wherein the carrier has at least one light-reflecting surface.

6. The lighting device as claimed in claim 2, wherein the carrier and the at least one ring-shaped reflector are arranged in such a way that the light that is reflected by the at least one ring-shaped reflector and impinges on the carrier impinges on a surface of the carrier at an angle of incidence that is greater than or equal to the Brewster angle of the carrier material.

7. The lighting device as claimed in claim 1, wherein the laser light sources are each equipped with a collimator.

8. The lighting device as claimed in claim 1, wherein the laser light sources are embodied as laser light sources that emit blue light, and the at least one light conversion element comprises phosphor designed to convert the light emitted by the laser light sources proportionally into light from the spectral range of yellow light with a dominant wavelength from the wavelength range of 560 nm to 590 nm.

9. The lighting device as claimed in claim 1, wherein at least two different sets of laser light sources are provided, and wherein laser light sources belonging to different sets of laser light sources are arranged around the ring axis of the at least one ring-shaped reflector in a manner offset relative to one another.

10. The lighting device as claimed in claim 1, wherein the at least one ring-shaped reflector or the laser light sources or the at least one light conversion element is/are mounted rotatably about the ring axis of the at least one ring-shaped reflector.

11. The lighting device as claimed in claim 4, wherein the carrier has at least one light-reflecting surface.

* * * * *